(12) United States Patent
Mori (10) Patent No.: US 7,115,964 B2
(45) Date of Patent: Oct. 3, 2006

(54) MANUFACTURING METHOD FOR SOI SEMICONDUCTOR DEVICE, AND SOI SEMICONDUCTOR DEVICE

(75) Inventor: Toru Mori, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/134,391

(22) Filed: May 23, 2005

(65) Prior Publication Data

US 2005/0205935 A1    Sep. 22, 2005

Related U.S. Application Data

(62) Division of application No. 10/748,259, filed on Dec. 31, 2003, now Pat. No. 6,924,183.

(30) Foreign Application Priority Data

Jun. 13, 2003    (JP) .............................. 2003-169161

(51) Int. Cl.
*H01L 29/00* (2006.01)
(52) U.S. Cl. .................. 257/508; 257/520; 257/347
(58) Field of Classification Search ................ 257/520, 257/508, E21.585
See application file for complete search history.

(56) References Cited

U.S. PATENT DOCUMENTS

| | | | | |
|---|---|---|---|---|
| 5,663,588 A | * | 9/1997 | Suzuki et al. | 257/350 |
| 5,939,755 A | * | 8/1999 | Takeuchi et al. | 257/347 |
| 6,013,542 A | * | 1/2000 | Yamazaki et al. | 438/132 |
| 6,188,122 B1 | * | 2/2001 | Davari et al. | 257/532 |
| 6,552,435 B1 | * | 4/2003 | Noble | 257/773 |
| 6,642,564 B1 | * | 11/2003 | Ogawa et al. | 257/296 |
| 6,653,221 B1 | * | 11/2003 | Subramanian et al. | 438/620 |
| 2001/0035578 A1 | * | 11/2001 | Liang et al. | 257/706 |
| 2004/0129977 A1 | * | 7/2004 | Ohkubo et al. | 257/347 |

FOREIGN PATENT DOCUMENTS

JP         08330250 A    * 12/1996

* cited by examiner

*Primary Examiner*—Jerome Jackson
*Assistant Examiner*—José R. Diaz
(74) *Attorney, Agent, or Firm*—Rabin & Berdo P.C.

(57) ABSTRACT

A manufacturing method for an SOI semiconductor device includes creating transistors and an element isolation region on a semiconductor layer in an SOI substrate. The method also includes covering the transistors and the element isolation region with a first insulation film. The method also includes creating a first opening section which penetrates the first insulation film, element isolation region and a buried oxide film to expose the support substrate. The method also includes creating a first source interconnect, first drain interconnect and first gate interconnect which are electrically connected to the transistors, on the second insulation film. The method also includes forming dummy interconnects which are connected with these interconnects, and are electrically connected with the support substrate via the first opening section, on the second insulation film. The method also includes disconnecting the dummy interconnects to electrically insulate the first source interconnect, first drain interconnect and first gate interconnect from the support substrate.

4 Claims, 7 Drawing Sheets

MANUFACTURING METHOD FOR SOI SEMICONDUCTOR DEVICE, AND SOI SEMICONDUCTOR DEVICE

This is a Divisional of U.S. application Ser. No. 10/748,259, filed Dec. 31, 2003 U.S. Pat. No. 6,924,183.

BACKGROUND OF THE INVENTION

1. Field of the Invention

The present invention relates to a manufacturing method for an SOI semiconductor device, and more particularly to a manufacturing method for an SOI semiconductor device, which includes creating transistors and an element isolation region on an SOI substrate. The SOI substrate has a support substrate and a semiconductor layer formed on the support substrate via an insulation film. SOI stands for Silicon On Insulator.

2. Description of the Related Art

One of semiconductor devices which consume less power and operate at a high speed is an SOI semiconductor device. The SOI semiconductor device has an SOI substrate, and transistors and an element isolation region are created on a semiconductor layer of the SOI substrate. The SOI substrate has the semiconductor layer created on a support substrate made of silicon via an insulation film, such as buried oxide film. In a semiconductor manufacturing process, if down sizing (size reduction, miniaturization) should be achieved, the gate insulation film becomes thinner and devices with a high charging damage, such as a high density plasma CVD device and high density plasma etching device, must be used. As a result, the thin gate insulation film is exposed to the charging damage, the gate insulation film deteriorates, and the characteristics of the transistors deteriorate due to the insufficient withstand voltage of the gate insulation film and the generation of an interface level at the interface of the gate insulation film.

A conventional manufacturing method for an SOI semiconductor device is disclosed in, for example, Japanese Patent Application Kokai (Laid-Open Publication) No. 8-330250; particularly, page 5 and FIG. 1 are relevant. In this manufacturing method, a dummy pattern for shorting the gate interconnect to the support substrate is created together with the gate interconnect. Then, the dummy pattern is etched, and the gate interconnect and the support substrate are insulated.

In the manufacturing method according to Japanese Patent Application Kokai No. 8-330250, electric charges entered from the plasma to the gate interconnect during an etching process are released to the support substrate via the dummy interconnects, but Japanese Patent Application Kokai No. 8-330250 states nothing on the electric charges which enter the source/drain interconnect. It is assumed that since transistors are directly created on the support substrate, the electric charges in the source/drain interconnect can possibly be released from the source/drain region to the support substrate. In the SOI semiconductor device, however, the buried oxide film exists on the support substrate, so that the electric charges of the source/drain interconnect cannot be released to the support substrate; the electric charges are stored in the source/drain region. Because of this, a large potential difference is generated between the source/drain region and the gate electrode, that is, a large electric field is applied to the gate insulation film, and the gate insulation film receives the charging damage. In this case, the withstand voltage of the gate insulation film may deteriorate, and the characteristics of the transistors may deteriorate by the interface level, which is generated at the interface of the gate insulation film.

SUMMARY OF THE INVENTION

One object of the present invention is to reduce the charging damage during the manufacturing process of the SOI semiconductor device so as to improve the characteristics of the transistors.

According to one aspect of the present invention, there is provided an improved manufacturing method for an SOI semiconductor device. The manufacturing method includes providing an SOI substrate having a support substrate, a first insulation film and a semiconductor layer. The semiconductor layer is formed on the support substrate via the first insulation film. The manufacturing method also includes forming transistors and an element isolation region on the semiconductor layer in the SOI substrate. The manufacturing method also includes covering the transistors and the element isolation region with a second insulation film. The method also includes forming a first opening section which penetrates the second insulation film, the element isolation region and the first insulation film to expose the support substrate. The manufacturing method also includes forming a first source interconnect, a first drain interconnect, and a first gate interconnect which are electrically connected to the transistors, on the second insulation film. The manufacturing method also includes forming dummy interconnects which are connected with the first source interconnect, first drain interconnect and first gate interconnect and are electrically connected with the support substrate via the first opening section, on the second insulation film. The method also includes disconnecting the dummy interconnects to electrically insulate the first source interconnect, first drain interconnect and first gate interconnect from the support substrate.

When the first source interconnect, first drain interconnect and first gate interconnect are created, the dummy interconnects for electrically connecting these interconnects with the support substrate are created simultaneously. Therefore, even if electric charges enter these interconnects during the interconnect pattern creation step, these electric charges are released to the support substrate via the dummy interconnects. Because of this, the electric field, which is applied to the gate insulation film due to the difference between the electric charges stored in the respective interconnects, can be decreased, and the charging damage, which is applied to the gate insulation film, can be decreased. As a result, the deterioration of the withstand voltage of the gate insulation film is suppressed, and the generation of the interface level at the interface of the gate insulation film is suppressed. Thus, the characteristics of the transistors can be improved.

Other objects, aspects and advantages of the present invention will become apparent to those skilled in the art to which the present invention pertains from the subsequent detailed description and appended claims, taken in conjunction with the accompanying drawings.

DETAILED DESCRIPTION OF THE INVENTION (1) FIRST EMBODIMENT

FIG. 1 to FIG. 7 are diagrams depicting the flow of the manufacturing method for the SOI semiconductor device according to the first embodiment of the present invention. Here the MOS FET created on the SOI substrate will be described as an example.

Figure 1:
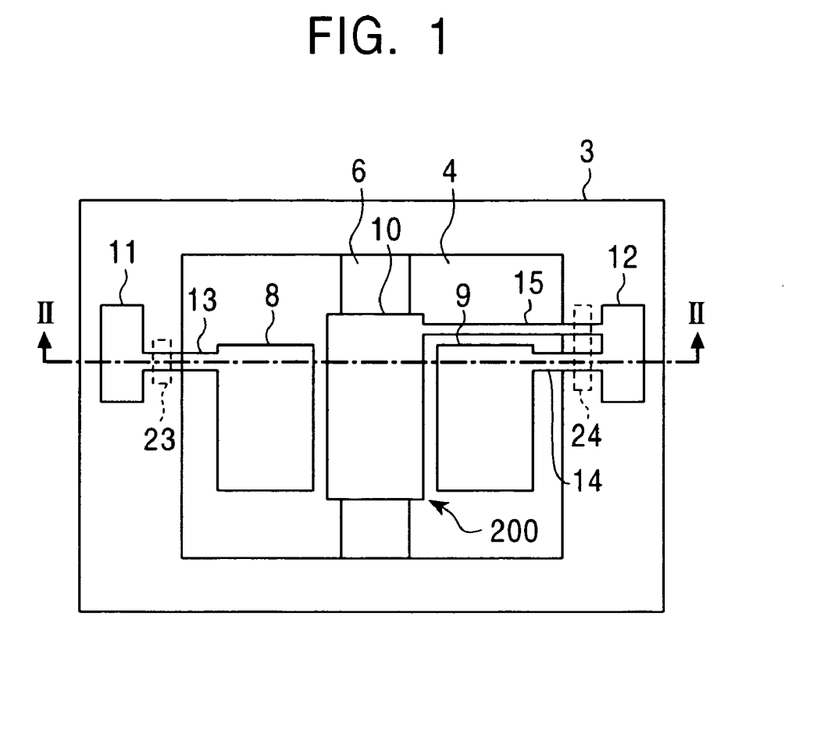
FIG. 1 is a top view depicting the manufacturing flow of the SOI semiconductor device according to the first embodiment.
Figure 2:
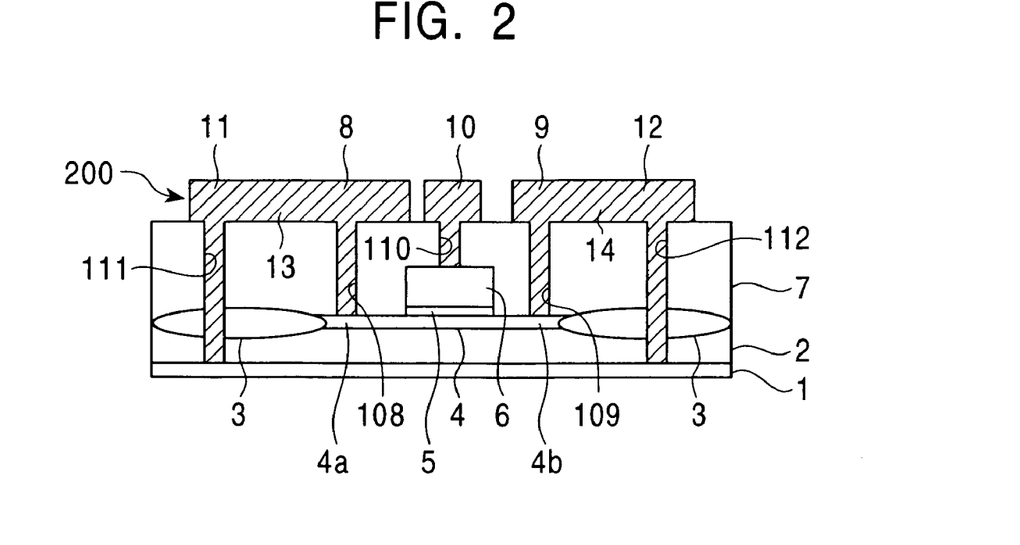
FIG. 2 is a cross sectional view, taken along the line II—II in FIG. 1, depicting the manufacturing flow of the SOI semiconductor device according to the first embodiment.
Figure 7:
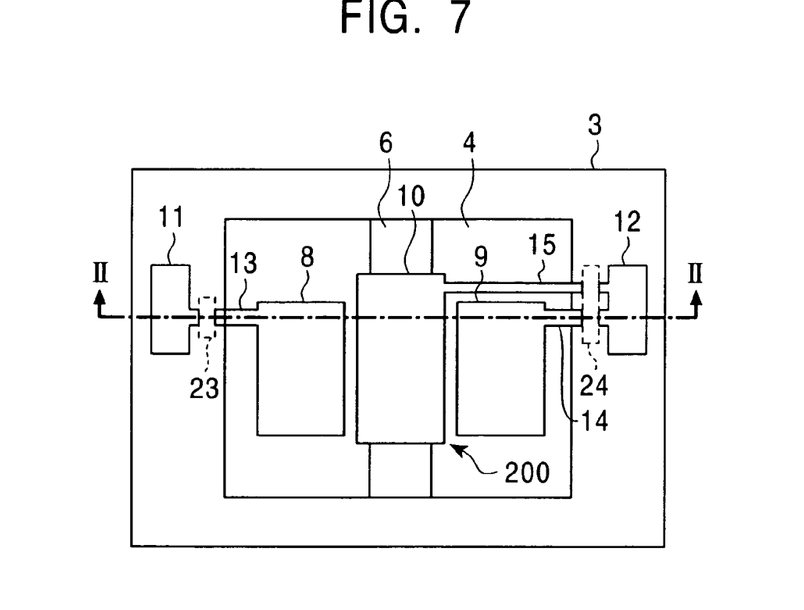
FIG. 7 is a top view, depicting the manufacturing flow of the SOI semiconductor device according to the first embodiment.

FIG. 1 is a top view of the SOI semiconductor device created up to the 1M interconnect pattern 200, and FIG. 2 is a cross-sectional view sectioned along the line II—II in FIG. 1. In FIG. 1 and FIG. 7, a part of the layers is omitted for convenience of explanation. As FIG. 1 and FIG. 2 show, in the semiconductor layer created on the support substrate 1 via a buried oxide film 2, such as $SiO_2$, the diffusion region 4 (activated region) is isolated by the element isolation region 3 which is comprised of an insulation film. A gate insulation film 5, which is made from $SiO_2$, and a gate electrode 6, which is made from a conductive film of p-Si, are created on the diffusion region 4. In the illustrated embodiment, the semiconductor layer is formed on the support substrate 1 via the buried oxide film 2, but any suitable insulation film (e.g., nitride film) may be used instead of the oxide film 2. After covering the gate insulation film 5 and gate electrode 6 with an interlayer insulation film 7, which is made of $SiO_2$, a resist pattern is created on the interlayer insulation film 7. Then, the interlayer insulation film 7 is etched to create the opening sections 108 to 110.

Subsequently, the element isolation region 3 and the buried insulation film 2 are etched to create the opening sections 111 and 112. The opening sections 108 and 109 are created penetrating the interlayer insulation film 7, so that the diffusion region 4 is exposed. The opening section 110 is created penetrating the interlayer insulation film 7, so that the gate electrode 6 is exposed. The opening sections 111 and 112 are created penetrating the interlayer insulation film 7, element isolation region 3 and the buried oxide film 2 so that the support substrate 1 is exposed. Then ions are implanted through the opening sections 108 and 109, and heat treatment is performed. As a result, the source region 4a and the drain region 4b are formed as high density diffusion regions respectively in the areas exposed by the opening sections 108 and 109 of the diffusion region 4.

Then a 1M interconnect film, which is made of Al or an Al alloy, for example, is deposited on the interlayer insulation film 7, and processed by RIE (Reactive Ion Etching) so that a 1M interconnect pattern 200 is created. The 1M interconnect pattern 200 includes a source interconnect 8 having a source electrode, a drain interconnect 9 having a drain electrode, a gate interconnect 10, dummy sections 13 to 15, and contact sections 11 and 12. In the dummy section 13, the contact section 11 buried in the opening section 111 is electronically connected to the source interconnect 8. In the dummy section 15, the contact section 12 buried in the opening section 112 is electrically connected to the drain interconnect 9 and the gate interconnect 10 respectively. By the etching applied to the 1M interconnect pattern 200, the source interconnect 8, drain interconnect 9 and gate interconnect 10 of 1M interconnect pattern are electrically shorted to the support substrate 1 via the dummy sections 13 to 15 and the contact sections 11 and 12, so that the electric charges which enter the source interconnect 8, drain interconnect 9 and gate interconnect 10 from plasma are released to the support substrate 1 via the dummy sections 13 to 15 and contact sections 11 and 12. In the dummy sections 13 to 15, the source interconnect 8, drain interconnect 9 and gate interconnect 10 are electrically shorted to the support substrate 1 via the contact sections 11 and 12 during the period from the creation of the first interconnect pattern 200 to the creation of the PV film 21, and are disconnected after the PV film 21 is created. In other words, the dummy sections 13 to 15 play a role of a fuse for electrically shorting and insulating the source interconnect 8, drain interconnect 9, and gate interconnect 10 to and from the support substrate 1.

Figure 3:
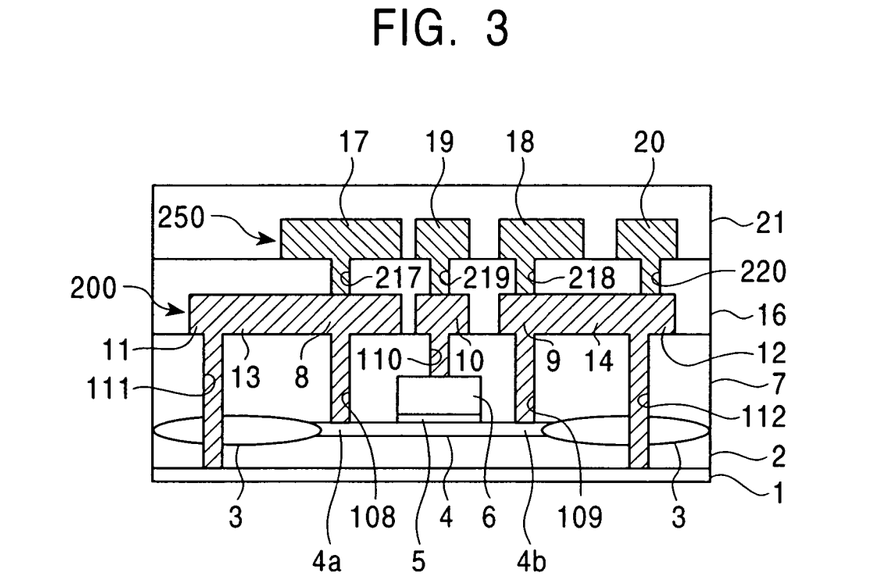
FIG. 3 is a second cross sectional view, depicting the manufacturing flow of the SOI semiconductor device according to the first embodiment.

Then as FIG. 3 shows, the interlayer insulation film 16, which is made of $SiO_2$, is deposited covering the 1M interconnect pattern 200 by high density plasma CVD. Since the source interconnect 8, drain interconnect 9 and gate interconnect 10 of the 1M interconnect pattern are electrically shorted to the support substrate 1 via the dummy sections 13 to 15 and the contact sections 11 and 12, the electric charges which enter the source interconnect 8, drain interconnect 9 and gate interconnect 10 from plasma are released to the support substrate 1 via the dummy sections 13 to 15 and contact sections 11 and 12. Then the resist pattern is created on the interlayer insulation film 16. After creating the opening sections 217 to 220 by etching, a 2M interconnect film, which is made of Al or an Al alloy, for example, is created on the interlayer insulation film 16. After creating the resist pattern on the 2M interconnect film, the 2M interconnect pattern 250 is created by RIE etching. The 2M interconnect pattern 250 includes the source interconnect 17, which is electrically connected to the source interconnect 8 of the 1M interconnect pattern via the opening section 217, the drain interconnect 18, which is electrically connected to the drain interconnect 9 of the 1M interconnect pattern via the opening section 218, the gate interconnect 19, which is electrically connected to the gate interconnect 10 of the 1M interconnect pattern via the opening section 219, and the contact section 20, which is electrically connected to the contact section 12 of the 1M interconnect pattern via the opening section 220. By the etching applied to the 2M interconnect pattern 250, the source interconnect 17, drain interconnect 18 and gate interconnect 19 of the 2M interconnect pattern are electrically shorted to the source interconnect 8, drain interconnect 9 and gate interconnect 10 of the 1M interconnect pattern respectively. Therefore, even if the electric charges enter the source interconnect 17, drain interconnect 18 and gate interconnect 19 from plasma, the electric charges are released to the support substrate 1 from the source interconnect 8, drain interconnect 9 and gate interconnect 10 of the 1M interconnect pattern via the dummy sections 13 to 15 and contact sections 11 and 12.

Figure 4:
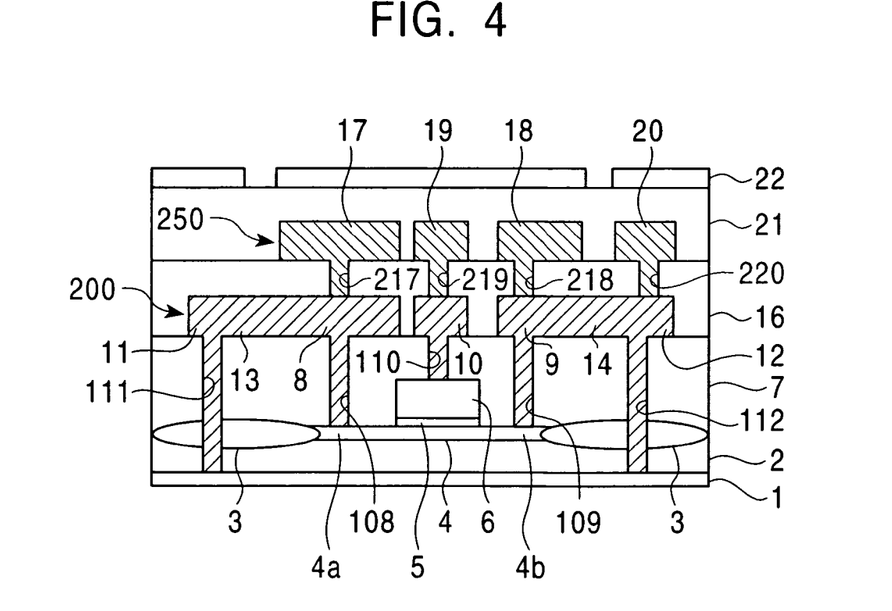
FIG. 4 is a third cross sectional view, depicting the manufacturing flow of the SOI semiconductor device according to the first embodiment.
Figure 5:
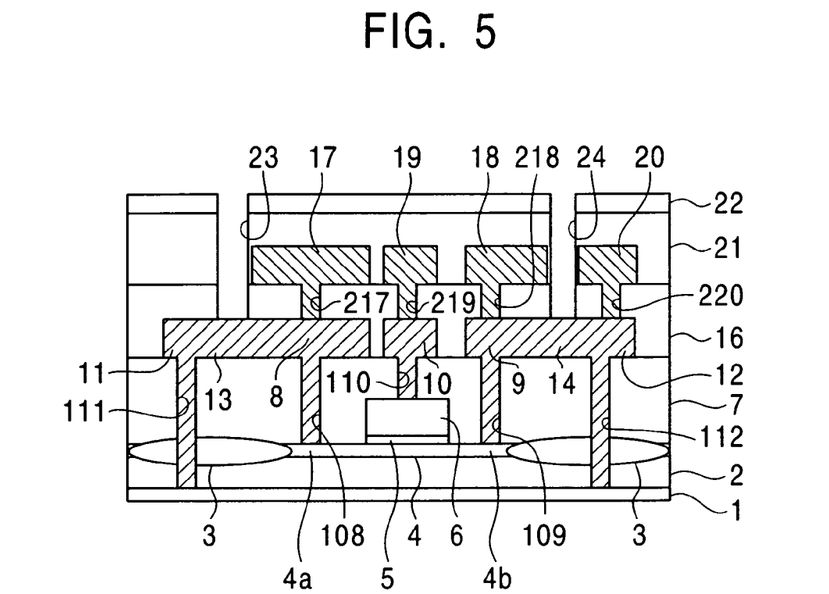
FIG. 5 is a fourth cross sectional view, depicting the manufacturing flow of the SOI semiconductor device according to the first embodiment.
Figure 6:
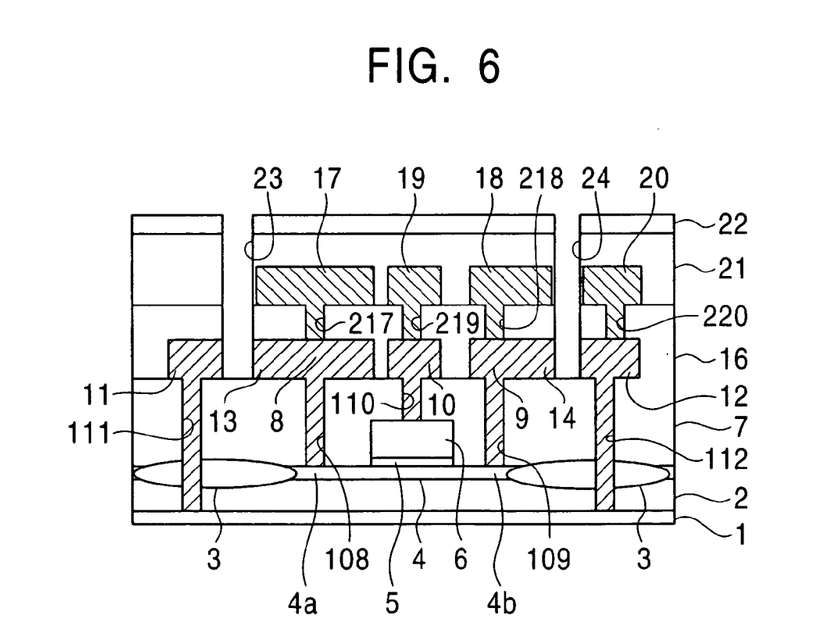
FIG. 6 is a fifth cross sectional view, depicting the manufacturing flow of the SOI semiconductor device according to the first embodiment.

Then, the PV film (insulation film) 21, which is made of SiNx, is deposited so as to cover the 2M interconnect pattern, and the resist pattern 22, which has two opening sections on the PV film 21, is created as shown in FIG. 4. Subsequently, as shown in FIG. 5, the PV film 21 and the interlayer insulation film 16 are etched via the two opening sections, so that the opening section 23, which exposes the dummy section 13, and the opening section 24, which exposes the dummy sections 14 and 15, are created in the PV film 21 and the interlayer insulation film 16 as shown in FIG. 1. After that, as shown in FIG. 6 and FIG. 7, the dummy section 13 exposed in the opening section 23, and the dummy sections 14 and 15 exposed in the opening section 24, are disconnected by a laser repair machine.

Instead of disconnecting the dummy sections 13 to 15 by the laser repair machine, the creation of the opening sections 23 and 24 and the disconnection of the dummy sections 13 to 15 may be performed by a single etching process. Specifically, the opening sections 23 and 24 of the PV film 21 and the interlayer insulation film 16 may be processed (formed) by etching as shown in FIG. 5, and then the etching gas may be switched and supplied into the opening sections 23 and 24 to disconnect the dummy sections 13 to 15, as shown in FIG. 6 and FIG. 7.

In the case of a semiconductor device with a bulk structure, the buried oxide film does not exist between the support substrate and the diffusion region which constitutes the source/drain region. Accordingly, even if the electric charges enter the source interconnect and drain interconnect from plasma, the electric charges can be released from the source region and drain region to the support substrate. In the case of a semiconductor device created on the SOI substrate, on the other hand, the buried oxide film 2 exists between the support substrate 1 and the diffusion region 4 which constitutes the source region 4a and drain region 4b. Therefore, the electric charges which enter the source interconnect 7 and drain interconnect 9 from plasma cannot be directly released from the diffusion region 4 to the support substrate 1; the electric charges are stored in the diffusion region 4. Since the electric charge amount stored in the source region 4a and drain region 4b is different from the electric charge amount stored in the gate electrode 6, depending on the antenna ratio of the interconnects, a large potential difference is generated between the diffusion region 4 and the gate electrode 6, and a large electric field is applied to the gate insulation film 5. Because of this, the gate insulation film 5 deteriorates, and the withstand voltage of the gate insulation film 5 deteriorates. In addition, an interface level is generated at the interface of the gate insulation film 5, and the performance of the transistor deteriorates.

So in the manufacturing method according to the present embodiment, when the 1M interconnect pattern 200 is etched, the dummy sections 13 to 15 and the contact sections 11 and 12, for electrically shorting the source interconnect 8, drain interconnect 9 and gate interconnect 10 to the support substrate 1, are created simultaneously. Consequently, even if the electric charges enter the source interconnect 8, drain interconnect 9 and gate interconnect 10 from plasma, the electric charges can be released to the support substrate 1 via the dummy sections 13 to 15 and contact sections 11 and 12. Thus, it is possible to prevent the electric charges from being stored in the source region 4a, drain region 4b and gate electrode 6.

Also, when the interlayer insulation film 16 is created on the surface of the 1M interconnect pattern 200 by high density plasma CVD, the electric charges which enter the source interconnect 8, drain interconnect 9 and gate interconnect 10 can be released to the support substrate 1.

Further, when the 2M interconnect pattern is etched, the source interconnect 17, drain interconnect 18 and gate interconnect 19 of the 2M interconnect pattern 250 are shorted to the source interconnect 8, drain interconnect 9 and gate interconnect 10 of the 1M interconnect pattern respectively. Therefore the electric charges which enter the source interconnect 17, drain interconnect 18 and gate interconnect 19 of the 2M interconnect pattern can be released respectively from the source interconnect 8, drain interconnect 9 and gate interconnect 10 of the 1M interconnect pattern to the support substrate 1 via the dummy sections 13 to 15 and the contact sections 11 and 12. When the PV film 21 is created, the electric charges which enter the source interconnect 17, drain interconnect 18 and gate interconnect 19 of the 2M interconnect pattern can be released to the support substrate 1 in the same way.

By releasing the electric charges which enter the interconnects to the support substrate 1 as described above, the charging damage which the gate insulation film 5 receives can be decreased. As a result, the deterioration of the withstand voltage of the gate insulation film 5 can be suppressed, and the generation of an interface level at the interface of the gate insulation film 5 can be suppressed. Thus, the characteristics of the SOI semiconductor device can be improved.

(2) SECOND EMBODIMENT

FIG. 8 to FIG. 14 depict the flow of the manufacturing method of the SOI semiconductor device according to the second embodiment of the present invention. Similar reference numerals are used in the first and second embodiments to designate similar elements.

Figure 8:
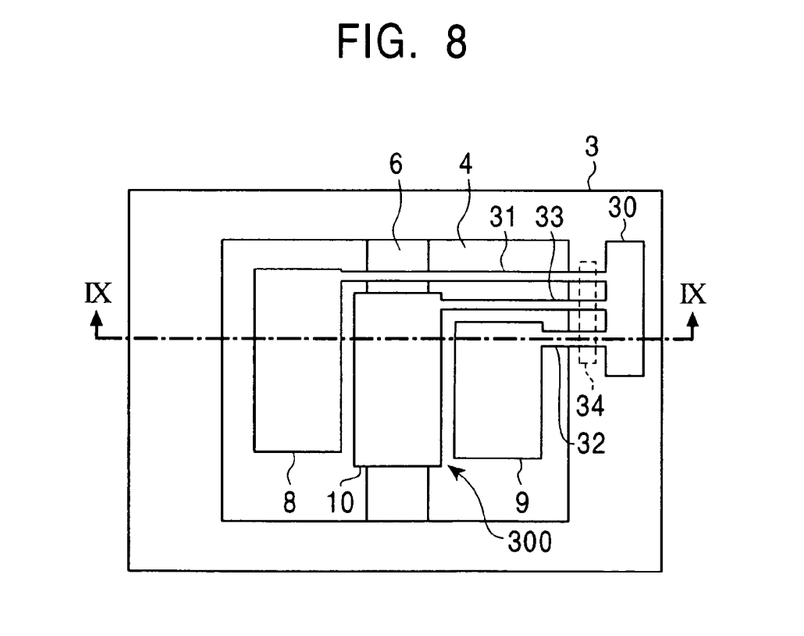
FIG. 8 is a top view, depicting the manufacturing flow of the SOI semiconductor device according to the second embodiment.
Figure 9:
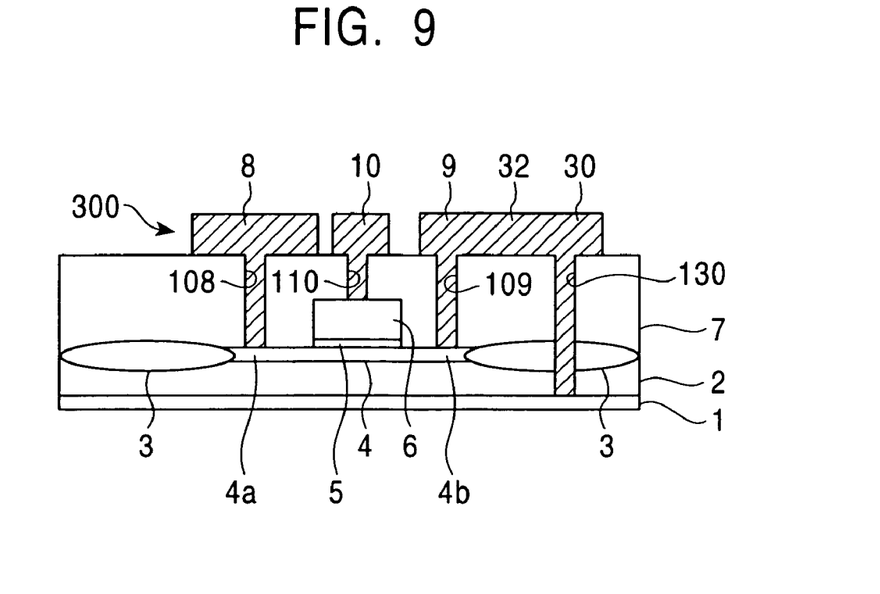
FIG. 9 is a cross sectional view, taken along the line IX to IX in FIG. 8, depicting the manufacturing flow of the SOI semiconductor device according to the second embodiment.
Figure 14:
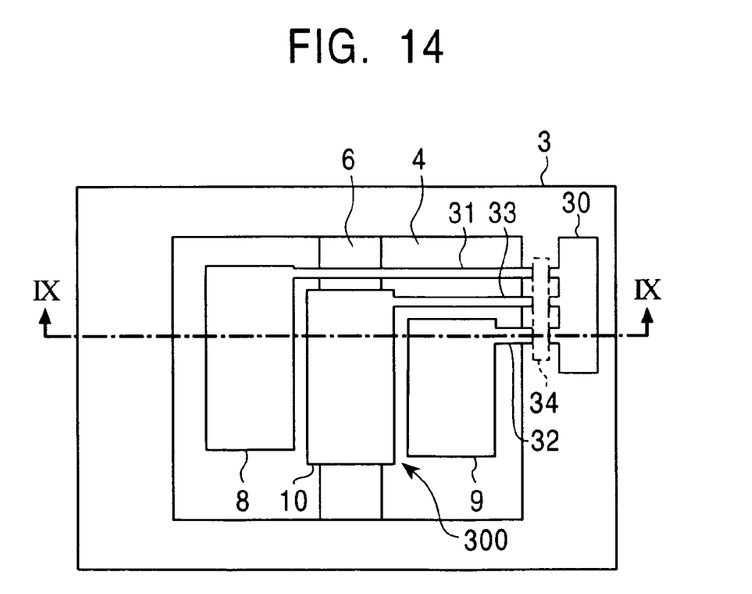
FIG. 14 is a top view, depicting the manufacturing flow of the SOI semiconductor device according to the modification to the second embodiment.

FIG. 8 is a top view of the SOI semiconductor device created up to the 1M interconnect pattern 300, and FIG. 9 is a cross-sectional view sectioned along the line IX—IX in FIG. 8. In FIG. 8 and FIG. 14, a part of the layers is omitted for convenience of explanation. As FIG. 8 and FIG. 9 show, in the semiconductor layer created on the support substrate 1 via a buried oxide film 2 (e.g., $SiO_2$), the diffusion region 4 (activated region) is isolated by the element isolation region 3 which is comprised of an insulation film. A gate insulation film 5, which is made of $SiO_2$, and a gate electrode 6, which is made from a conductive film of p-Si, are created on the diffusion region 4. After covering the gate insulation film 5 and gate electrode 6 with an interlayer insulation film 7, which is made of $SiO_2$, a resist pattern is created on the interlayer insulation film 7. Then, the interlayer insulation film 7 is etched to create the opening sections 108 to 110, and the element isolation region 3 and the buried insulation film 2 are etched to create the opening section 130. The opening sections 108 and 109 are created penetrating the interlayer insulation film 7 so that the diffusion area 4 is exposed. The opening section 110 is created penetrating the interlayer insulation film 7 so that the gate electrode 6 is exposed. The opening section 130 is created penetrating the interlayer insulation film 7, element isolation region 3, and buried oxide film 2, so that the support substrate 1 is exposed. Then ions are implanted through the opening section 108 and 109, and heat treatment is performed. As a result, the source region 4a and drain region 4b are created as high density diffusion regions respectively in the areas exposed by the opening sections 108 and 109 of the diffusion region 4.

The 1M interconnect pattern 300 includes a source interconnect 8 having a source electrode, a drain interconnect 9 having a drain electrode, a gate interconnect 10, dummy sections 31 to 33 and a contact section 30. In the dummy sections 31 to 33, the contact selection 30 buried in the opening section 130 is electrically connected to the source interconnect 8, drain interconnect 9 and gate interconnect 10 respectively. By the etching applied to the 1M interconnect pattern 300, the source interconnect 8, drain interconnect 9 and gate interconnect 10 of the 1M interconnect pattern are electrically shorted to the support substrate 1 via the dummy sections 31 to 33 and contact section 30. Therefore, the electric charges which enter into the source interconnect 8, drain interconnect 9 and gate interconnect 10 from plasma are released to the support substrate 1 via the dummy sections 31 to 33 and contact section 30. The dummy sections 31 to 33 electrically short the source interconnect 8, drain interconnect 9 and gate interconnect 10 to the support substrate 1 via the contact section 30 during the period from the creation of the first interconnect pattern 300 to the creation of the PV film 21. The dummy sections 31 to 33 electrically disconnect the interconnects 8 to 10 from the support substrate 1 after the PV film 21 is created. In other words, the dummy sections 31 to 33 serve as a fuse for electrically shorting or insulating the source interconnect 8, drain interconnect 9 and gate interconnect 10 to or from the support substrate 1.

Figure 10:
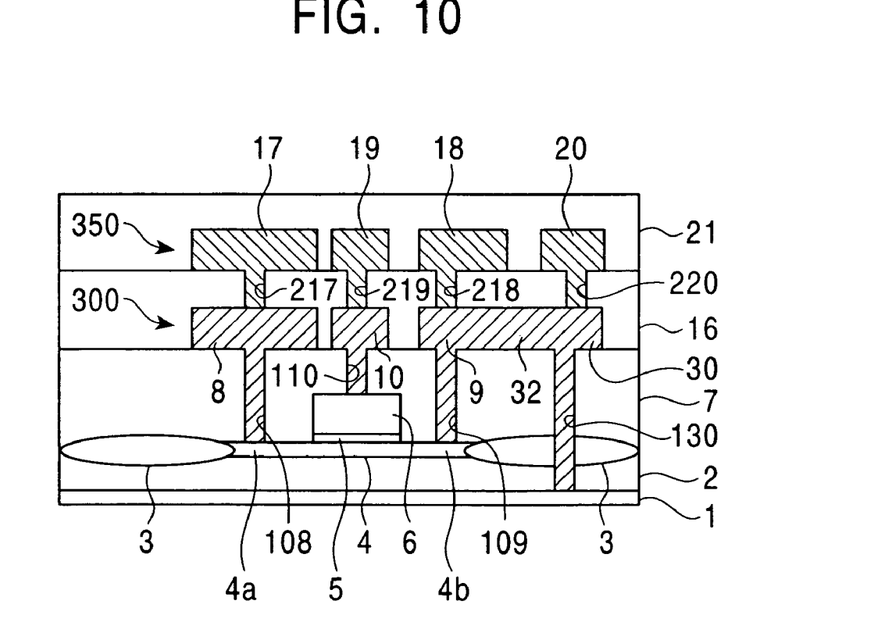
FIG. 10 is a second cross sectional view, depicting the manufacturing flow of the SOI semiconductor device according to the second embodiment.

Then as FIG. 10 shows, the interlayer insulation film 16, which is made of SiO$_2$, is deposited covering the 1M interconnect pattern 300 by high density plasma CVD. The source interconnect 8, drain interconnect 9 and gate interconnect 10 of the 1M interconnect pattern are electrically shorted to the support substrate 1 via the dummy sections 31 to 33 and the contact section 30, so that the electric charges which enter the source interconnect 8, drain interconnect 9 and gate interconnect 10 from plasma are released to the support substrate 1 via the dummy sections 31 to 33 and the contact section 30. Then the resist pattern is created on the interlayer insulation film 16. After creating the opening sections 217 to 220 by etching, the 2M interconnect film, which is made of Al or an Al alloy, for example, is created on the interlayer insulation film 16. After creating the resist pattern on the 2M interconnect film, the 2M interconnect pattern 350 is created by RIE etching. The 2M interconnect pattern 350 includes the source interconnect 17, which is electrically connected to the source interconnect 8 of the 1M interconnect pattern via the opening section 217, the drain interconnect 18, which is electrically connected to the drain interconnect 9 of the 1M interconnect pattern via the opening section 218, the gate interconnect 19, which is electrically connected to the gate interconnect 10 of the 1M interconnect pattern via the opening section 219, and the contact section 20, which is electrically connected to the contact section 30 of the 1M interconnect pattern via the opening section 220. By the etching applied to the 2M interconnect pattern 350, the source interconnect 17, drain interconnect 18 and gate interconnect 19 of the 2M interconnect pattern are electrically shorted to the source interconnect 8, drain interconnect 9 and gate interconnect 10 of the 1M interconnect pattern respectively, so that the electric charges which enter the source interconnect 17, drain interconnect 18 and gate interconnect 19 from plasma are released to the support substrate 1 from the source interconnect 8, drain interconnect 9 and gate interconnect 10 of the 1M interconnect pattern 300 respectively via the dummy sections 31 to 33 and contact section 30.

Figure 11:
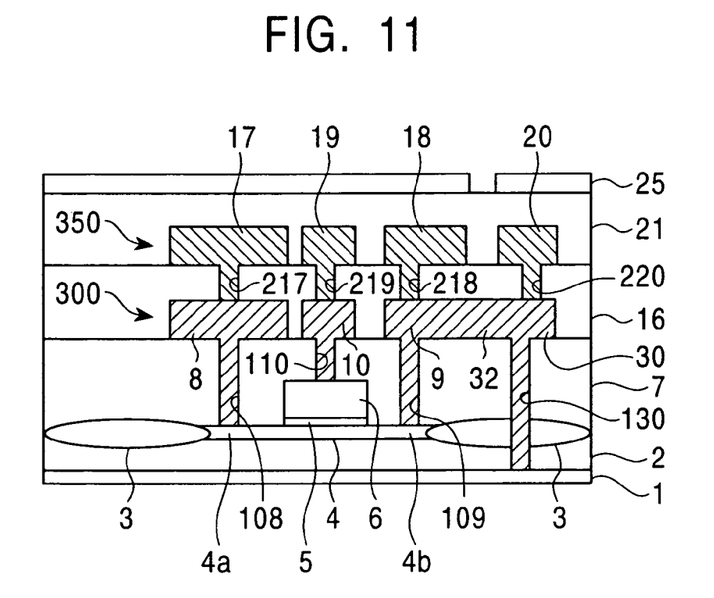
FIG. 11 is a third cross sectional view, depicting the manufacturing flow of the SOI semiconductor device according to the second embodiment.
Figure 12:
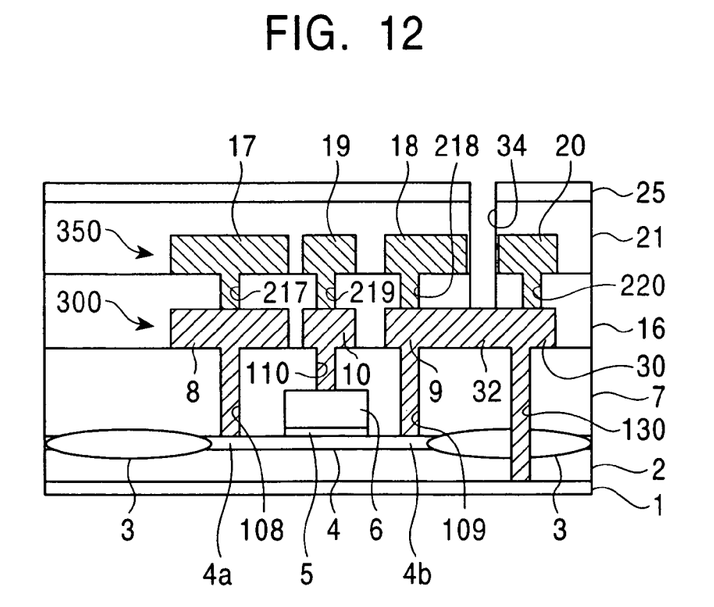
FIG. 12 is a fourth cross sectional view, depicting the manufacturing flow of the SOI semiconductor device according to the second embodiment.
Figure 13:
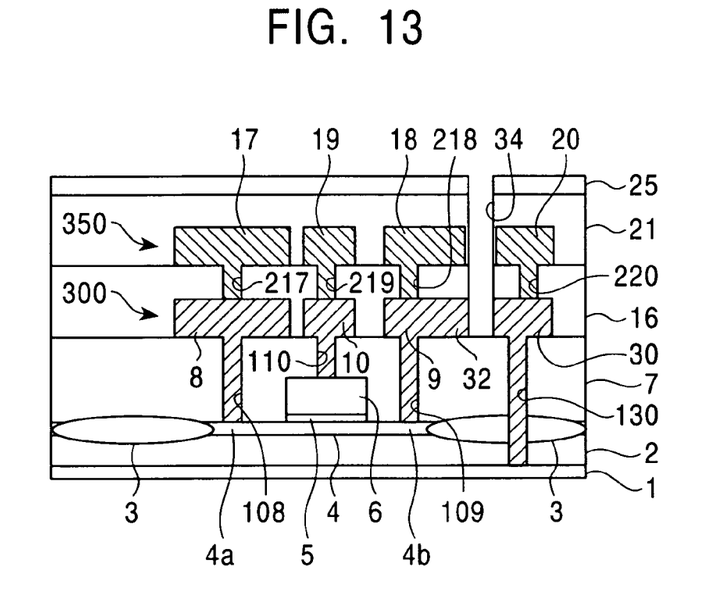
FIG. 13 is a fifth cross sectional view, depicting the manufacturing flow of the SOI semiconductor device according to a modification to the second embodiment.

Then the PV film (insulation film) 21, which is made of SiNx, is deposited so as to cover the 2M interconnect pattern 350, and the resist pattern 25, which has one opening section on the PV film 21, is created as shown in FIG. 11. Subsequently, as shown in FIG. 12, the PV film 21 and the interlayer insulation film 16 are etched via the one opening section, and the opening section 34, which exposes the dummy sections 31 to 33, is created in the PV film 21 and the interlayer insulation film 16 as shown in FIG. 8. Then as FIG. 13 and FIG. 14 show, the dummy sections 31 to 33 exposed in the opening section 34 are disconnected by the laser repair machine.

Instead of disconnecting the dummy sections 31 to 33 by the laser repair machine, the creation of the opening section 34 and the disconnection of the dummy sections 31 to 33 may be performed by a single etching process. Specifically, the opening section 34 of the PV film 21 and the interlayer insulation film 16 may be processed (formed) by etching as shown in FIG. 12, and the etching gas may be switched and supplied into the opening 34 to disconnect the dummy sections 13 to 15 as shown in FIG. 13 and FIG. 14.

Like the first embodiment, when the 1M interconnect pattern 300 is etched and the interlayer insulation film 16 is deposited, the source interconnect 8, drain interconnect 9 and gate interconnect 10 are electrically shorted to the support substrate 1. Therefore, the electric charges which enter the source interconnect 8, drain interconnect 9 and gate interconnect 10 from plasma can be released to the support substrate 1 via the dummy sections 31 to 33 and contact section 30.

When the 2M interconnect pattern 350 is etched and the PV film 21 is deposited, the 2M interconnect pattern 350 is electrically shorted to the support substrate 1 via the 1M interconnect pattern 300, so the electric charges which enter the source interconnect 17, drain interconnect 18 and gate interconnect 19 of the 2M interconnect pattern can be released from the source interconnect 8, drain interconnect 9 and gate interconnect 10 of the 1M interconnect pattern 300 respectively to the support substrate 1 via the dummy sections 31 to 33 and contact section 30.

As described above, according to this embodiment (second embodiment), the deterioration of the withstand voltage of the gate insulation film can be suppressed, and the generation of the interface level at the interface of the gate insulation film can be suppressed. Consequently, the characteristics of the SOI semiconductor device can be improved, as with the first embodiment.

In the present embodiment, it is sufficient to create only one contact section 30 in order to short the source interconnect 8, drain interconnect 9 and gate interconnect 10 to the support substrate 1. In addition, it is sufficient to create only one opening section 34 for exposing the dummy sections 31 to 33 since the dummy sections 31 to 33 are disposed adjacent to each other. Therefore, the manufacturing steps can be simple.

This application is based on a Japanese Patent Application No. 2003-169161, and the entire disclosure thereof is incorporated herein by reference.

The invention claimed is:

1. An SOI semiconductor device, comprising:
   an SOI substrate including a support substrate, a first insulation film and a semiconductor layer formed on the support substrate via the first insulation film;
   at least one transistor and an element isolation region formed on the semiconductor layer;
   a second insulation film covering the at least one transistor and the element isolation region;
   a first opening section which penetrates the second insulation film, element isolation region and first insulation film;
   a first source interconnect, a first drain interconnect and first gate interconnect which are formed on the second insulation film and are electrically connected to the at least one transistor; and
   dummy interconnects which are electrically connected to the first source interconnect, first drain interconnect and first gate interconnect, and are disconnected after being created by being electrically connected to the support substrate via the first opening section.

2. The SOI semiconductor device according to claim 1, further comprising:
   a third insulation film which covers the first source interconnect, first drain interconnect and first gate interconnect; and
   a second source interconnect, second drain interconnect and second gate interconnect which are electrically connected to the first source interconnect, first drain interconnect and first gate interconnect respectively, and are formed on the third insulation film.

3. The SOI semiconductor device according to claim 1, wherein the first opening section includes two opening sections, and the dummy interconnects electrically connect the first source interconnect and first drain interconnect to the support substrate via the two opening sections of the first opening section respectively, and electrically connect the first gate interconnect to the support substrate via one of the two opening sections of the first opening section.

4. The SOI semiconductor device according to claim 1, wherein the first opening section includes one opening section, and the dummy interconnects electrically connect the first source interconnect, first drain interconnect and gate interconnect to the support substrate via the one opening section.

* * * * *